US010607705B2

(12) United States Patent
Lee et al.

(10) Patent No.: US 10,607,705 B2
(45) Date of Patent: Mar. 31, 2020

(54) MEMORY DEVICE INCLUDING A DETERIORATION LEVEL DETECTION CIRCUIT

(71) Applicant: SAMSUNG ELECTRONICS CO., LTD., Suwon-si, Gyeonggi-do (KR)

(72) Inventors: Han Jun Lee, Gunpo-si (KR); Seung Bum Kim, Hwaseong-si (KR); Il Han Park, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/047,384

(22) Filed: Jul. 27, 2018

(65) Prior Publication Data

US 2019/0214091 A1 Jul. 11, 2019

(30) Foreign Application Priority Data

Jan. 10, 2018 (KR) .................. 10-2018-0003475

(51) Int. Cl.
| | |
|---|---|
| *G11C 16/34* | (2006.01) |
| *G11C 16/26* | (2006.01) |
| *G11C 16/30* | (2006.01) |
| *G11C 11/56* | (2006.01) |
| *G11C 29/50* | (2006.01) |
| *G11C 29/42* | (2006.01) |
| *G11C 29/00* | (2006.01) |

(Continued)

(52) U.S. Cl.
CPC .............. *G11C 16/26* (2013.01); *G06F 11/07* (2013.01); *G11C 11/5642* (2013.01); *G11C 16/30* (2013.01); *G11C 16/349* (2013.01); *G11C 16/3427* (2013.01); *G11C 29/00* (2013.01); *G11C 29/42* (2013.01); *G11C 29/50* (2013.01); *G11C 29/50004* (2013.01); *G11C 16/0483* (2013.01); *G11C 2029/5002* (2013.01)

(58) Field of Classification Search
CPC .............. G11C 16/3495; G11C 16/349; G11C 16/3427
USPC ..................................................... 365/185.09
See application file for complete search history.

(56) References Cited

U.S. PATENT DOCUMENTS

| | | | |
|---|---|---|---|
| 7,391,650 B2 | 6/2008 | Mokhlesi et al. | |
| 9,001,579 B2 | 4/2015 | Song et al. | |
| 9,576,666 B2 * | 2/2017 | Shim .................. | G11C 16/0483 |

(Continued)

FOREIGN PATENT DOCUMENTS

KR 10-2017-0086173 7/2017

*Primary Examiner* — Son L Mai
(74) *Attorney, Agent, or Firm* — F. Chau & Associates, LLC

(57) ABSTRACT

A memory device includes a voltage generator that provides a read voltage to a selected word line and provides a pass voltage to a plurality of unselected word lines, and a deterioration level detection circuit. The selected word line and the unselected word lines are connected to a plurality of memory cells. The deterioration level detection circuit detects a deterioration level of memory cells connected to the selected word line based on data of memory cells that receive the read voltage. The memory cells connected to the selected word line and the memory cells that receive the read voltage are included in the plurality of memory cells. The voltage generator changes the pass voltage provided to the unselected word lines based on the deterioration level.

7 Claims, 18 Drawing Sheets

(51) Int. Cl.
    *G06F 11/07*         (2006.01)
    *G11C 16/04*       (2006.01)

(56)            References Cited

U.S. PATENT DOCUMENTS

| | | |
|---|---|---|
| 9,612,957 B2 | 4/2017 | Brokhman et al. |
| 9,666,292 B2 | 5/2017 | Kim |
| 9,721,652 B2 | 8/2017 | Puthenthermadam et al. |
| 9,747,157 B2 | 8/2017 | Ellis et al. |
| 9,910,607 B2 * | 3/2018 | Yoon .................... G06F 3/0619 |
| 2010/0232229 A1 | 9/2010 | Ogawa et al. |
| 2015/0049548 A1 | 2/2015 | Park et al. |
| 2017/0083249 A1 | 3/2017 | Yang et al. |

\* cited by examiner

MEMORY DEVICE INCLUDING A DETERIORATION LEVEL DETECTION CIRCUIT

CROSS-REFERENCE TO RELATED APPLICATIONS

This application priority under 35 U.S.C. § 119 to Korean Patent Application No. 10-2018-0003475 filed on Jan. 10, 2018, the disclosure of which is incorporated by reference herein in its entirety.

TECHNICAL FIELD

Exemplary embodiments of the present inventive concept relate to a memory device.

DISCUSSION OF THE RELATED ART

Semiconductor memory devices may be categorized as volatile semiconductor memory devices and non-volatile semiconductor memory devices. Volatile semiconductor memory devices are fast in terms of reading and writing, but have a limitation in which stored data is lost when the power supply is cut off. In contrast, non-volatile semiconductor memory devices preserve data stored therein when the power supply is interrupted. Therefore, non-volatile semiconductor memory devices are used to store data that needs to be preserved.

A flash memory device is an example of a non-volatile memory device. Flash memory devices have been widely used in voice and image data storage media of information devices such as, for example, computers, mobile phones, smartphones, personal digital assistants (PDAs), digital cameras, camcorders, voice recorders, MP3 players, hand-held PCs, game machines, fax machines, scanners, and printers. Recently, high capacity, high speed input/output, and low power consumption technologies for non-volatile memory devices for mounting on mobile devices, such as smartphones, have been actively researched.

SUMMARY

Exemplary embodiments of the present inventive concept provide a memory device that changes a pass voltage supplied to an unselected word line based on a deterioration level of a threshold voltage of memory cells connected to a selected word line.

According to an exemplary embodiment of the present inventive concept, a memory device includes a voltage generator that provides a read voltage to a selected word line and provides a pass voltage to a plurality of unselected word lines, and a deterioration level detection circuit. The selected word line and the unselected word lines are connected to a plurality of memory cells. The deterioration level detection circuit detects a deterioration level of memory cells connected to the selected word line based on data of memory cells that receive the read voltage. The memory cells connected to the selected word line and the memory cells that receive the read voltage are included in the plurality of memory cells. The voltage generator changes the pass voltage provided to the unselected word lines based on the deterioration level.

According to an exemplary embodiment of the inventive concept, a memory device includes a voltage generator, a dummy voltage supply unit, a deterioration level detection circuit, and a pass voltage change circuit. The voltage generator provides a read voltage to a selected word line and provides a pass voltage to a plurality of unselected word lines. The selected word line and the unselected word lines are connected to a plurality of memory cells. The dummy voltage supply unit provides a dummy voltage to the selected word line before the read voltage is provided to the selected word line. The deterioration level detection circuit detects a deterioration level of memory cells connected to the selected word line based on data of memory cells that receive the dummy voltage. The memory cells connected to the selected word line and the memory cells that receive the dummy voltage are included in the plurality of memory cells. The pass voltage change circuit changes the pass voltage provided to the unselected word lines based on the deterioration level.

According to an exemplary embodiment of the inventive concept, a memory device includes a memory cell array and a pass voltage change circuit. The memory cell array includes a plurality of pages. Each of the pages includes a plurality of memory cells. The pass voltage change circuit changes a pass voltage supplied to pages connected to unselected word lines based on a deterioration level of memory cells included in a page connected to a selected word line. The pages connected to the unselected word lines and the page connected to the selected word line are included in the plurality of pages. The pass voltage change circuit provides the pass voltage having been changed to at least one page from among the pages connected to the unselected word lines.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
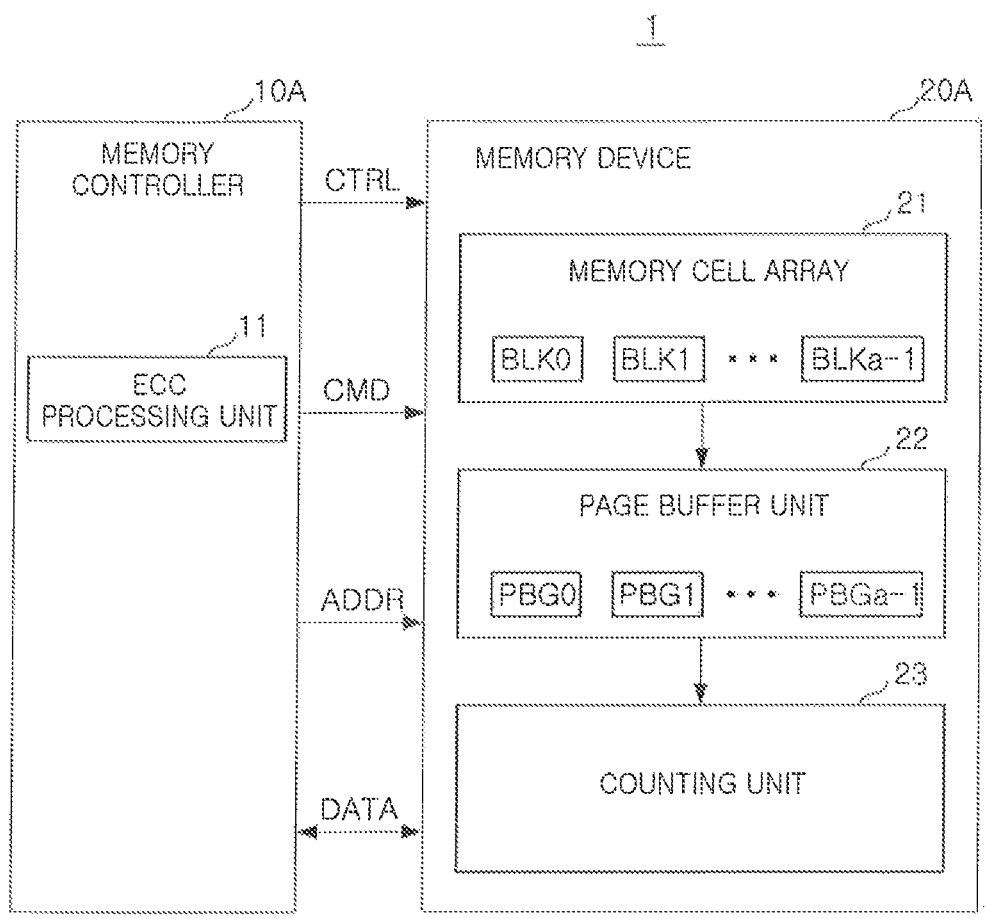
FIG. 1 is a schematic block diagram of a memory system according to an exemplary embodiment of the inventive concept.

Exemplary embodiments of the present inventive concept will be described more fully hereinafter with reference to the accompanying drawings. Like reference numerals may refer to like elements throughout the accompanying drawings.

Exemplary embodiments of the present inventive concept provide a non-volatile memory device that performs a data processing operation while minimizing or reducing the occurrence of error bits, and a data processing method thereof.

FIG. 1 is a schematic block diagram of a memory system according to an exemplary embodiment of the inventive concept.

Referring to FIG. 1, in an exemplary embodiment, a memory system 1 includes a memory controller 10A and a memory device 20A. The memory device 20A includes a memory cell array 21, a page buffer unit 22, and a counting unit 23.

The memory controller 10A includes an error correction circuit (ECC) processing unit 11. The memory controller 10A controls the memory device 20A. For example, the memory controller 10A may control a program operation, a read operation, and an erase operation for the memory device 20A by providing an address ADDR, a command CMD, and a control signal CTRL to the memory device 20A.

The memory cell array 21 includes a plurality of memory blocks BLK0 to BLKa−1, where a is an integer greater than or equal to 2. Each of the memory blocks BLK0 to BLKa−1 includes a plurality of pages. Each of the memory blocks BLK0 to BLKa−1 includes a plurality of memory cells disposed in regions in which a plurality of word lines and a plurality of bit lines intersect each other. In an exemplary embodiment, the plurality of memory cells may be flash memory cells, and the memory cell array 21 may be a NAND flash memory cell array or a NOR flash memory cell array. Hereinafter, exemplary embodiments of the present inventive concept will be described in detail with reference to an example in which the plurality of memory cells are flash memory cells. According to an exemplary embodiment, the plurality of memory cells may be, for example, resistive memory cells, thereby forming a resistive random access memory (RRAM), a phase change RAM (PRAM), or a magnetic RAM (MRAM).

The page buffer unit 22 may store data to be written in the memory cell array 21 or data read from the memory cell array 21. In an exemplary embodiment, the page buffer unit 22 includes a plurality of page buffer groups PBG0 to PBGa−1, where a is an integer greater than or equal to 2. The plurality of page buffer groups PBG0 to PBGa−1 may include a plurality of page buffers. In an exemplary embodiment, the number of page buffer groups PBG0 to PBGa−1 corresponds to the number of memory blocks BLK0 to BLKa−1. In an exemplary embodiment, the number of a plurality of page buffers included in respective page buffer groups PBG0 to PBGa−1 corresponds to the number of the plurality of bit lines included in respective memory blocks BLK0 to BLKa−1.

In a case in which a read operation for the memory device 20A is performed, the plurality of page buffers may store data of one or more memory cells selected from among the plurality of memory cells included in the memory cell array 21. In an exemplary embodiment, each of the plurality of page buffers may include at least one latch, and a latch signal may be provided to at least one latch, thereby latching data of memory cells.

In a case in which the read operation is performed to the memory device 20A, the plurality of page buffers may read and store data of one or more selected memory cells by a single read voltage. Alternatively, the plurality of page buffers may read and store data of one or more selected memory cells with read voltages having different levels and may perform a logical operation on stored data, respectively. In this case, each of the plurality of page buffers may perform an exclusive logical sum (XOR) operation using two pieces of data, respectively, read on two voltage magnitudes from among different voltage magnitudes similar to each other.

In an exemplary embodiment, the counting unit 23 counts a number of memory cells from data stored in the plurality of page buffers. In an exemplary embodiment, in a case in which a single read voltage is supplied, the counting unit 23 may count OFF cells or ON cells of the memory cells from data stored in each of the page buffers. In addition, in an exemplary embodiment, in a case in which a plurality of read voltages having different levels are supplied, the counting unit 23 may count a number of the ON cells of the memory cells present in each of a plurality of periods divided by different voltage magnitudes from data of a logical operation stored in each of the page buffers.

The ECC processing unit 11 may determine whether an error is present in data read from the memory device 20A. When the ECC processing unit 11 detects that an error is present, the error may be corrected. The ECC processing unit 11 may compare a parity generated and stored when data is programmed with a parity generated when data is read, detect an error bit of data, and correct a detected error bit.

Figure 2:
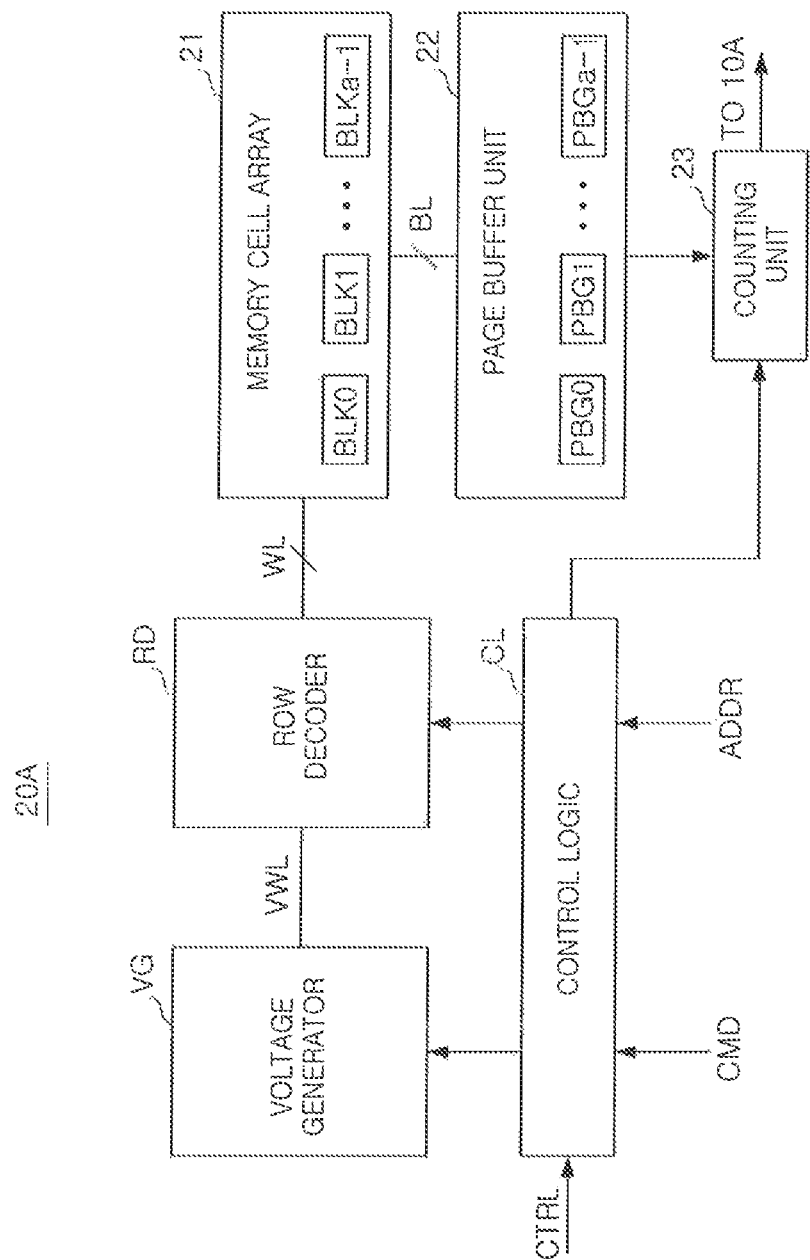
FIG. 2 is a detailed block diagram of a memory device included in the memory system of FIG. 1 according to an exemplary embodiment of the inventive concept.

FIG. 2 is a detailed block diagram of a memory device included in the memory system of FIG. 1 according to an exemplary embodiment of the inventive concept.

Referring to FIG. 2, in an exemplary embodiment, the memory device 20A includes the memory cell array 21, the page buffer unit 22, the counting unit 23, a control logic CL, a voltage generator VG, and a row decoder RD.

The control logic CL outputs various control signals to write data to the memory cell array 21 or to read data from the memory cell array 21, according to the command CMD, the address ADDR, and the control signal CTRL received from the memory controller 10A. Various control signals output by the control logic CL may be transmitted to the voltage generator VG, the row decoder RD, the page buffer unit 22, and the counting unit 23. The voltage generator VG may also be referred to herein as a voltage generator circuit, and the counting unit 23 may also be referred to herein as a counter or a counter circuit. In an exemplary embodiment, the voltage generator VG generates a driving voltage VWL that drives a plurality of word lines WL based on a control signal received from the control logic CL. The driving voltage VWL may be supplied as, for example, a program voltage, a read voltage, an erase voltage, or a pass voltage. The row decoder RD may activate one or more word lines from among the plurality of word lines WL based on a row address. In an exemplary embodiment, at a time of a read operation, the row decoder RD applies the read voltage to a selected word line and applies a pass voltage to an unselected word line, and at a time of a writing operation, the row decoder RD applies a program voltage to the selected word line and applies the pass voltage to the unselected word line. The plurality of page buffers included in the page buffer unit 22 is connected to the memory cell array 21 through a plurality of bit lines BL. At the time of the read operation, the plurality of page buffers may function as a sense amplifier to output data stored in the memory cell array 21, and at the time of the writing operation, the plurality of page buffers may act as a writing driver to input data to be stored in the memory cell array 21. Each of the plurality of page buffers may be connected to a data input/output circuit through a plurality of data lines.

In an exemplary embodiment, the counting unit 23 counts a number of memory cells from data stored in the plurality of page buffers. As described above, in a case in which a single read voltage is supplied, the counting unit 23 may count a number of OFF cells or ON cells of the memory cells. In a case in which a plurality of read voltages having different levels are supplied, the counting unit 23 may count a number of memory cells present in each of a plurality of periods divided by different voltage magnitudes.

Figure 3:
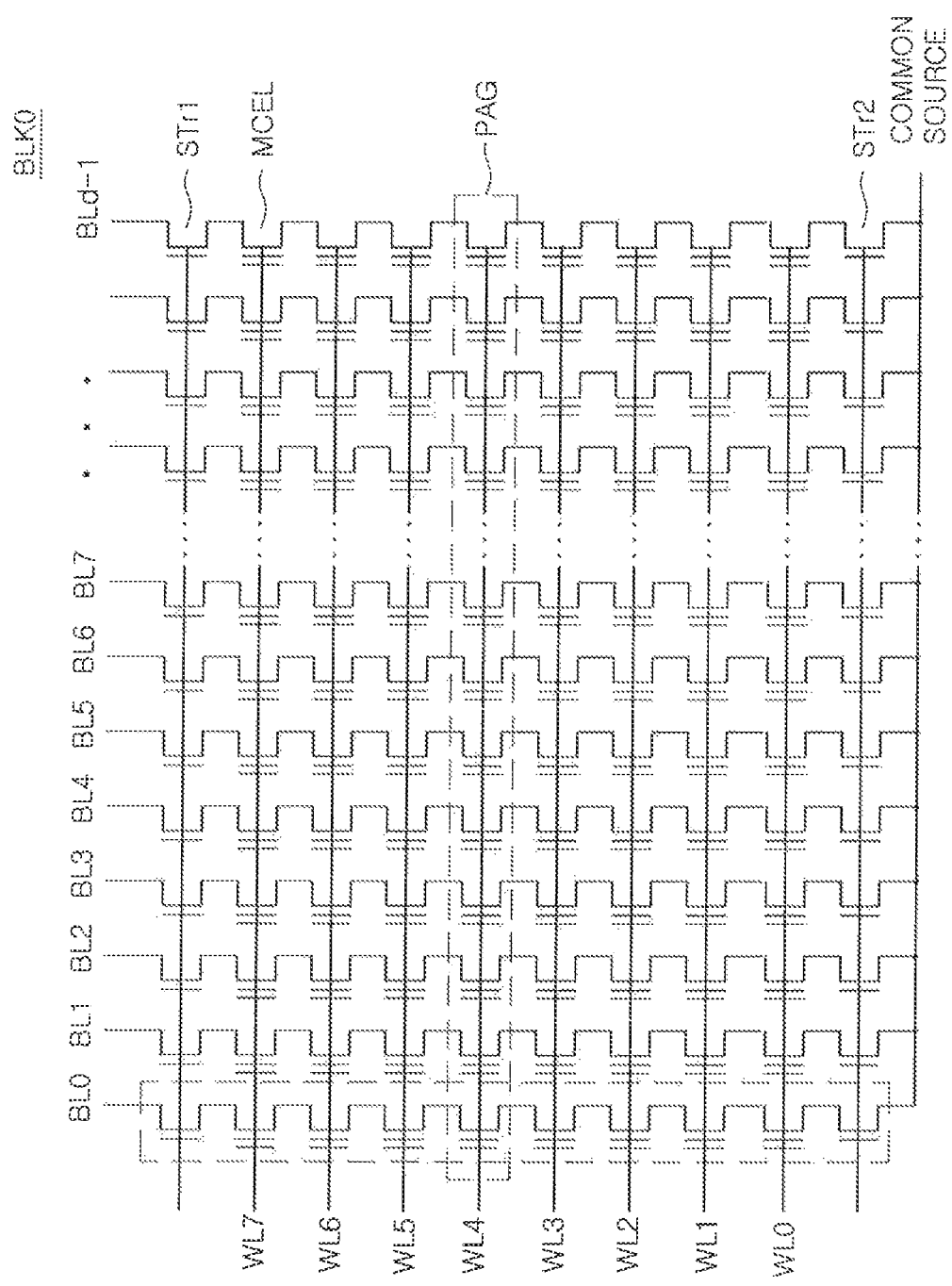
FIG. 3 is a circuit diagram of an exemplary embodiment of a memory block included in the memory cell array of FIGS. 1 and 2.

FIG. 3 is a circuit diagram of an exemplary embodiment of a memory block included in the memory cell array of FIGS. 1 and 2. In FIG. 3, only the structure of a block BLK0 is illustrated for convenience of illustration. It is to be understood that according to exemplary embodiments, other blocks BLK1 to BLKa−1 may have the same structure as that of the block BLK0 illustrated in FIG. 3.

The memory cell array 21 may be provided as a memory cell array of a NAND flash memory. In an exemplary embodiment, the block BLK0 includes d strings STR (d is an integer greater than or equal to 2) in which eight memory cells MCEL are connected in series in a direction of bit lines BL0 to BLd−1. Each string STR includes a drain select transistor STr1 and a source select transistor STr2, which are connected to opposing ends of memory cells MCEL connected in series. Each string STR is connected to a common source. A NAND flash memory device having a structure the same as that illustrated in FIG. 3 may perform an erase operation in block units and may perform a program operation in page PAG units corresponding to respective word lines WL0 to WL7. FIG. 3 illustrates an example in which eight pages PAG for eight word lines WL0 to WL7 are included in a single block. However, exemplary embodiments of the inventive concept are not limited thereto. For example, in an exemplary embodiment, the block BLK0 of the memory cell array 21 may include memory cells and pages, a number of which is different from that of memory cells MCEL and pages PAG illustrated in FIG. 3. In addition, in an exemplary embodiment, the memory device 20A of FIGS. 1 and 2 may include a plurality of memory cell arrays performing an operation the same as and having a structure the same as that of the memory cell array 21 described above.

Figure 4:
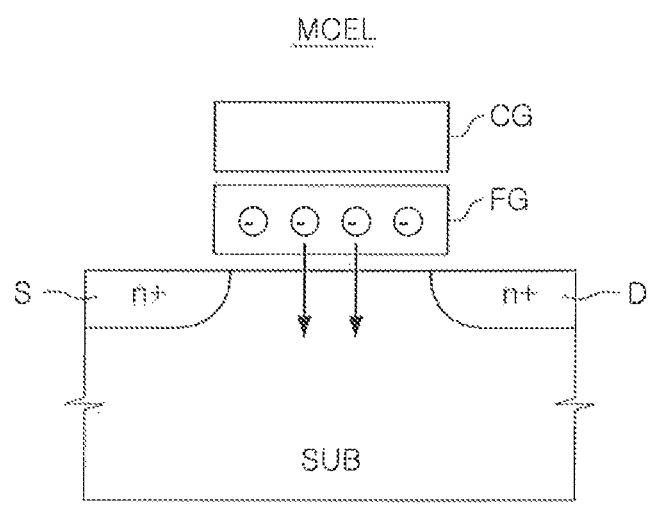
FIG. 4 is a cross-sectional view of an exemplary embodiment of a memory cell included in the memory block of FIG. 3.

FIG. 4 is a cross-sectional view of an exemplary embodiment of a memory cell included in the memory block of FIG. 3.

Referring to FIG. 4, in an exemplary embodiment, a source S and a drain D are formed on a substrate SUB, and a channel region is formed between the source S and the drain D. A floating gate FG is formed on the channel region. An insulating layer such as, for example, a tunneling insulating layer, may be disposed between the channel region and the floating gate FG. A control gate CG is formed on the floating gate FG. An insulating layer such as, for example, a blocking insulating layer, may be disposed between the floating gate FG and the control gate CG. Voltages required for a program operation, an erase operation, and a read operation for the memory cell MCEL may be applied to the source S, the drain D, and the control gate CG. In a flash memory device, data stored in the memory cell MCEL may be read by distinguishing a threshold voltage (Vth) of the memory cell MCEL. In this case, the threshold voltage (Vth) of the memory cell MCEL may be determined based on an amount of electrons stored in the floating gate FG. When a relatively large amount of electrons is stored in the floating gate FG, a level of the threshold voltage (Vth) of the memory cell MCEL may be increased. The electron stored in the floating gate FG of the memory cell MCEL may be leaked in a direction of the arrow shown in FIG. 4 due to various causes. Thus, the threshold voltage (Vth) of the memory cell MCEL may be changed. For example, in an exemplary embodiment, the electron stored in the floating gate FG may be leaked due to abrasion of the memory cell MCEL. In a case in which an access operation, such as the program operation, the erase operation, and the read operation for the memory cell MCEL, is repeated, an insulating film between the channel region and the floating gate FG may be worn out. Thus, the electron stored in the floating gate FG may be leaked. In an exemplary embodiment, the electron stored in the floating gate FG may be leaked due to high temperature stress, a temperature difference at the time of the program operation, the read operation, etc.

Figure 5:
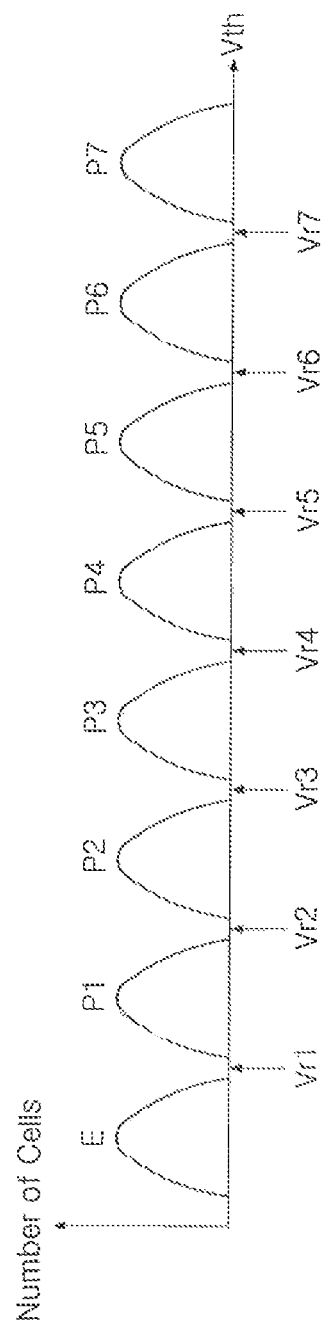
FIG. 5 is a graph illustrating dispersion according to a threshold voltage in a case in which the memory cell of FIG. 3 is a 3-bit multilevel cell.

FIG. 5 is a graph illustrating dispersion according to a threshold voltage in a case in which the memory cell MCEL of FIG. 3 is a triple level cell (TLC) storing 3-bit data per cell. Hereinafter, an operation will be described in a case in which the memory cell MCEL is the TLC. However, exemplary embodiments of the inventive concept are not limited thereto. For example, according to exemplary embodiments, the method described hereinafter may be applied to a quadruple level cell (QLC) storing 4-bit data per cell, and to a multilevel cell storing data in an amount of 4 bits or greater.

Referring to FIG. 5, the horizontal axis represents a threshold voltage (Vth) and the vertical axis represents a number of memory cells MCEL. In a case in which the memory cell MCEL is provided as a 3-bit multilevel cell, the memory cell MCEL may have one of an erase state E, a first program state P1, a second program state P2, a third program state P3, a fourth program state P4, a fifth program state P5, a sixth program state P6, and a seventh program state P7. In the case of the multilevel cell, as compared with a single-level cell, an interval between threshold voltage (Vth) dispersions is relatively narrow. As a result, in the multilevel cell, read reliability may be degraded due to a relatively small change of the threshold voltage (Vth). In FIG. 5, a first read voltage Vr1 has a voltage magnitude between a voltage magnitude at which dispersion of the memory cell MCEL having the erase state E occurs and a voltage magnitude dispersion of the memory cell MCEL having the first program state P1 occurs. A second read voltage Vr2 has a voltage magnitude between dispersion of the memory cell MCEL having the first program state P1 and dispersion of the memory cell MCEL having the second program state P2. A third read voltage Vr3 has a voltage magnitude between dispersion of the memory cell MCEL having the second program state P2 and dispersion of the memory cell MCEL having the third program state P3. A fourth read voltage Vr4 has a voltage magnitude between dispersion of the memory cell MCEL having the third program state P3 and dispersion of the memory cell MCEL having the fourth program state P4. A fifth read voltage Vr5 has a voltage magnitude between dispersion of the memory cell MCEL having the fourth program state P4 and dispersion of the memory cell MCEL having the fifth program state P5. A sixth read voltage Vr6 has a voltage magnitude between dispersion of the memory cell MCEL having the fifth program state P5 and dispersion of the memory cell MCEL having the sixth program state P6. A seventh read voltage Vr7 has a voltage magnitude between dispersion of the memory cell MCEL having the sixth program state P6 and dispersion of the memory cell MCEL having the seventh program state P7.

In a case in which the first read voltage Vr1 is applied to a control gate CG of the memory cell MCEL, the memory cell MCEL in the erase state E is turned on, and the memory cell MCEL in the first program state P1 is turned off. In a case in which the memory cell MCEL is turned on, an electric current flows through the memory cell MCEL. In a case in which the memory cell MCEL is turned off, an electric current does not flow through the memory cell MCEL. Therefore, data stored in the memory cell MCEL may be distinguished based on whether the memory cell MCEL is turned on or off.

In an exemplary embodiment, data may be distinguished in such a manner that, in a case in which the first read voltage Vr1 is applied thereto, and the memory cell MCEL is turned on, data '1' is stored, and in a case in which the memory cell MCEL is turned off, data '0' is stored. However, exemplary embodiments of the inventive concept are not limited thereto. For example, in an exemplary embodiment, data may be distinguished in such a manner that, in a case in which the first read voltage Vr1 is applied thereto, and the memory cell MCEL is turned on, data '0' is stored, and in a case in which the memory cell MCEL is turned off, data '1' is stored. As such, the assignment of a logical level of data may be changed according to exemplary embodiments of the inventive concept.

Figure 6:
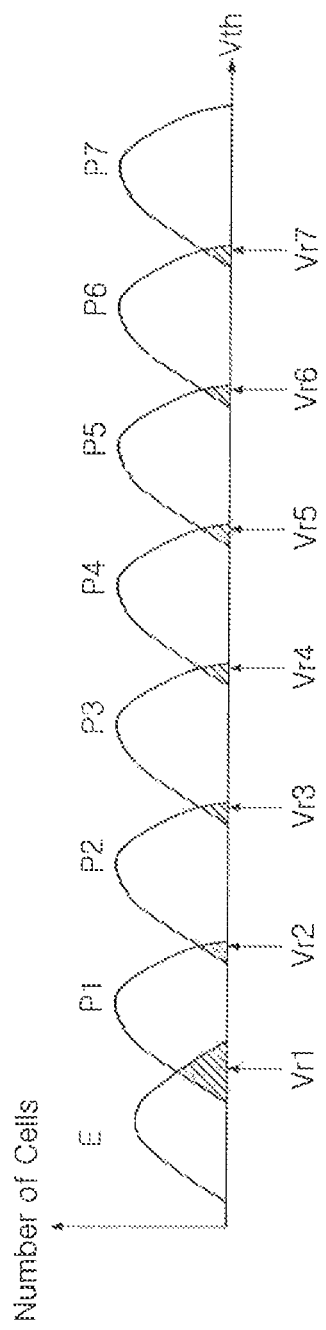
FIG. 6 is a graph illustrating a case in which the threshold voltage of the memory cell is changed in the graph of FIG. 5.

FIG. 6 is a graph illustrating a case in which a threshold voltage of a memory cell MCEL is changed in the graph of FIG. 5.

Referring to FIG. 6, respective memory cells MCEL programmed in the erase state E and the first to seventh program states P1 to P7 may have dispersion changed by an external stimulus and/or abrasion, as illustrated in FIG. 6. In FIG. 6, a read error may occur in memory cells MCEL belonging to a hatched portion. Therefore, the reliability of the memory device 20A may be degraded. For example, in a case in which a read operation for the memory device 20A is performed using the first read voltage Vr1, the memory cells MCEL belonging to the hatched portion may be determined to be in the erase state E due to a decrease in the threshold voltage Vth, even in the case in which the memory cells MCEL are programmed in the first program state P1. That is, among the memory cells programmed in the first program state P1, the memory cells in which the threshold voltage Vth is lower than the first read voltage Vr1 may be determined to be a fail bit for the first program state P1.

Figure 7:
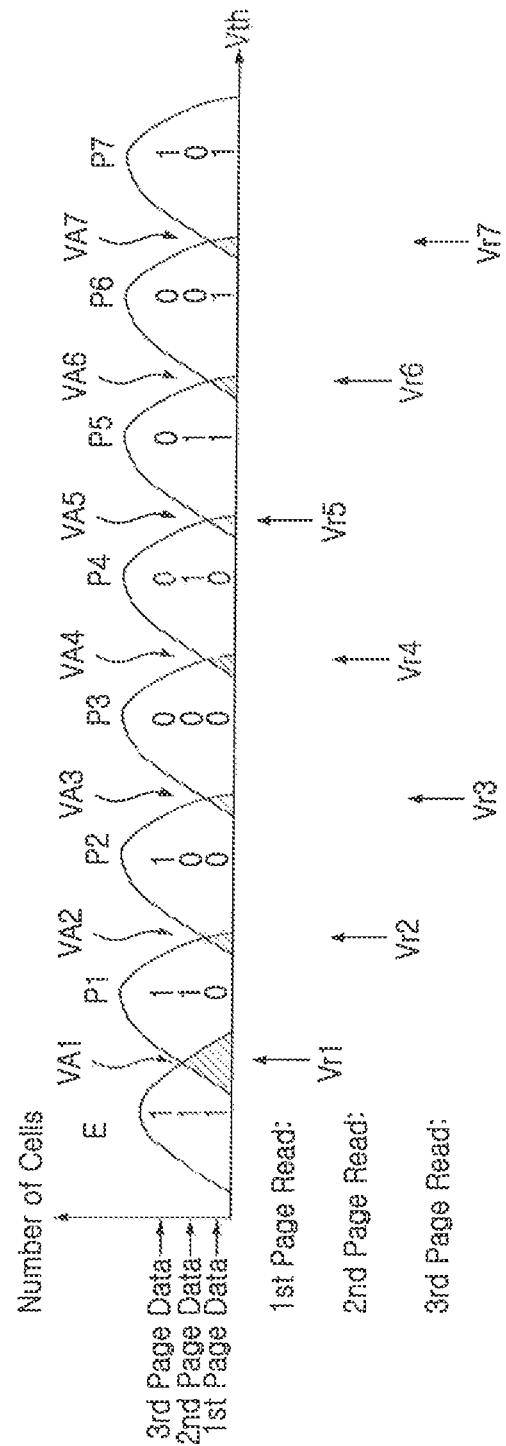
FIG. 7 is a graph illustrating a read operation in each page in a case in which the memory cell is the 3-bit multilevel cell.

FIG. 7 is a graph illustrating a read operation in each page in a case in which a memory cell is the 3-bit multilevel cell. A page of a 3-bit multilevel cell may include a plurality of bit pages. The plurality of bit pages may include a least significant bit (LSB) page, a central significant bit (CSB) page, and a most significant bit (MSB) page.

Referring to FIG. 7, in a case in which a memory cell MCEL is provided as a 3-bit multilevel cell, a read operation for the memory cell MCEL may be performed three times and may divide 8 pieces of status information into three bit pages to be output. In an exemplary embodiment, an erase state E is assigned data '111', a first program state P1 is assigned data '110', a second program state P2 is assigned data '100', a third program state P3 is assigned data '000', a fourth program state P4 is assigned data '010', a fifth program state P5 is assigned data '011', a sixth program state P6 is assigned data '001', and a seventh program state P7 is assigned data '101'. It is to be understood that these values are exemplary, and that according to exemplary embodiments, data assigned to each program state may be changed. A first page read corresponding to the LSB page may be performed by a read operation for a first valley VA1 between the erase state E and the first program state P1, and a read operation for a fifth valley VA5 between the fourth program state P4 and the fifth program state P5. A second page read corresponding to the CSB page may be performed by a read operation for a second valley VA2 between the first program state P1 and the second program state P2, a read operation for a fourth valley VA4 between the third program state P3 and the fourth program state P4, and a read operation for a sixth valley VA6 between the fifth program state P5 and the sixth program state P6. A third page read corresponding to the MSB page may be performed by a read operation for a third valley VA3 between the second program state P2 and the third program state P3 and a read operation for a seventh valley VA7 between the sixth program state P6 and the seventh program state P7.

In a case in which a read operation for the first valley VA1 and the fifth valley VA5 is performed in an operation of the first page read, when the memory cell is 'OFF CELL' in the first valley VA1, and the memory cell is 'ON cell' in the fifth valley VA5, first page data is output as '0'. Otherwise, the first page data is output as '1'. Subsequently, in a case in which the read operation for the second valley VA2, the fourth valley VA4, and the sixth valley VA6 is performed in an operation of a second page read, when the memory cell is 'OFF cell' in the second valley VA2, and the memory cell is 'ON cell' in the fourth valley VA4, the second page data is '0'. When the memory cell is 'OFF cell' in the sixth valley VA6, the second page data is output as '0'. Otherwise, the second page data is output as '1'. Subsequently, in a case in which the read operation for the third valley VA3 and the seventh valley VA7 is operated in an operation of the third page read, when the memory cell is 'OFF cell' in the third valley VA3, and the memory cell is 'ON cell' in the seventh valley VA7, the third page data is output as '0'. Otherwise, the third page data is output as '1'.

Referring to a comparative example, a read error may occur as a result of a pass voltage that has a relatively high level being supplied to an unselected word line. In a case in which the level of a pass voltage supplied to the unselected word line is decreased, the occurrence of the read error may be reduced. However, in a case in which the pass voltage is significantly decreased, a most significant state may not occur. Thus, referring to the comparative example, there is a limitation in decreasing the pass voltage.

A memory device according to exemplary embodiments of the inventive concept decreases the magnitude of the pass voltage using a tendency for dispersion of a threshold voltage of memory cells to be diffused as a retention state persists, thereby eliminating or reducing the occurrence of the read error described above.

Figure 8:
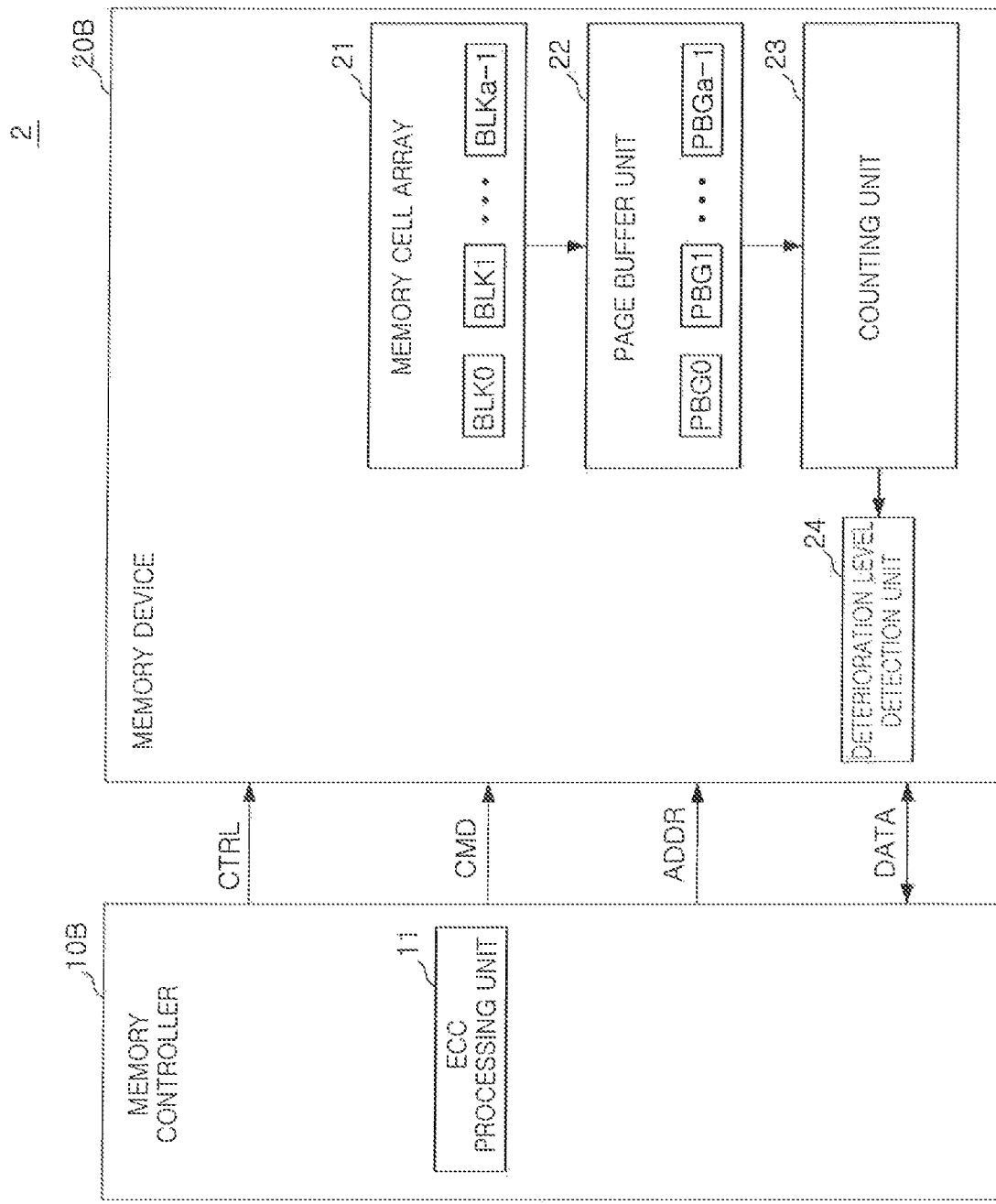
FIG. 8 is a schematic block diagram of a memory system according to an exemplary embodiment of the inventive concept.

FIG. 8 is a schematic block diagram of a memory system 2 according to an exemplary embodiment of the inventive concept. The memory system 2 according to the exemplary embodiment of FIG. 8 is similar to the memory system 1 according to the exemplary embodiment of FIG. 1. Therefore, for convenience of explanation, a further description of elements and processes previously described may be omitted, and the description below may focus only on differences between the memory system 2 of FIG. 8 and the memory system 1 of FIG. 1.

Referring to FIG. 8, in an exemplary embodiment, the memory system 2 further includes a deterioration level detection unit 24 included in a memory device 20B, as compared to the memory system 1 according to the exemplary embodiment of FIG. 1, which does not include the deterioration level detection unit 24 in the memory device 20A. In the memory system 2 of FIG. 8, the memory device 20B is connected to a memory controller 10B.

According to exemplary embodiments, the deterioration level detection unit 24 detects a deterioration level according to the counting result output by the counting unit 23. The deterioration level detection unit 24 may also be referred to herein as a deterioration level detection circuit. As described above, in a case in which memory cells MCEL are provided as 3-bit multilevel cells, eight read voltages are supplied to word lines of the memory cells MCEL, so that eight pieces of status information are divided and output in three bit pages. The counting unit 230 counts 'ON cells' or 'OFF cells' of memory cells from data of memory cells read by at least one of the eight read voltages. The deterioration level detection unit 24 detects a deterioration level according to a counting result of 'ON cells' or 'OFF cells' of the memory cells. For example, in an exemplary embodiment, the deterioration level detection unit 24 compares a counting result of ON cells or OFF cells, currently counted with a counting result of ON cells or OFF cells, in an initial state, thereby determining a change of a threshold voltage of the memory cells. The deterioration level detection unit 24 detects a deterioration level from the change of the threshold voltage of the memory cells. According to exemplary embodiments, the deterioration level is detected by a separate deterioration level detection unit 24, as illustrated in FIG. 8. However, exemplary embodiments of the inventive concept are not limited thereto. For example, according to exemplary embodiments, the deterioration level may be detected from a memory controller, and a detected deterioration level may be provided to a memory device.

Figure 9:
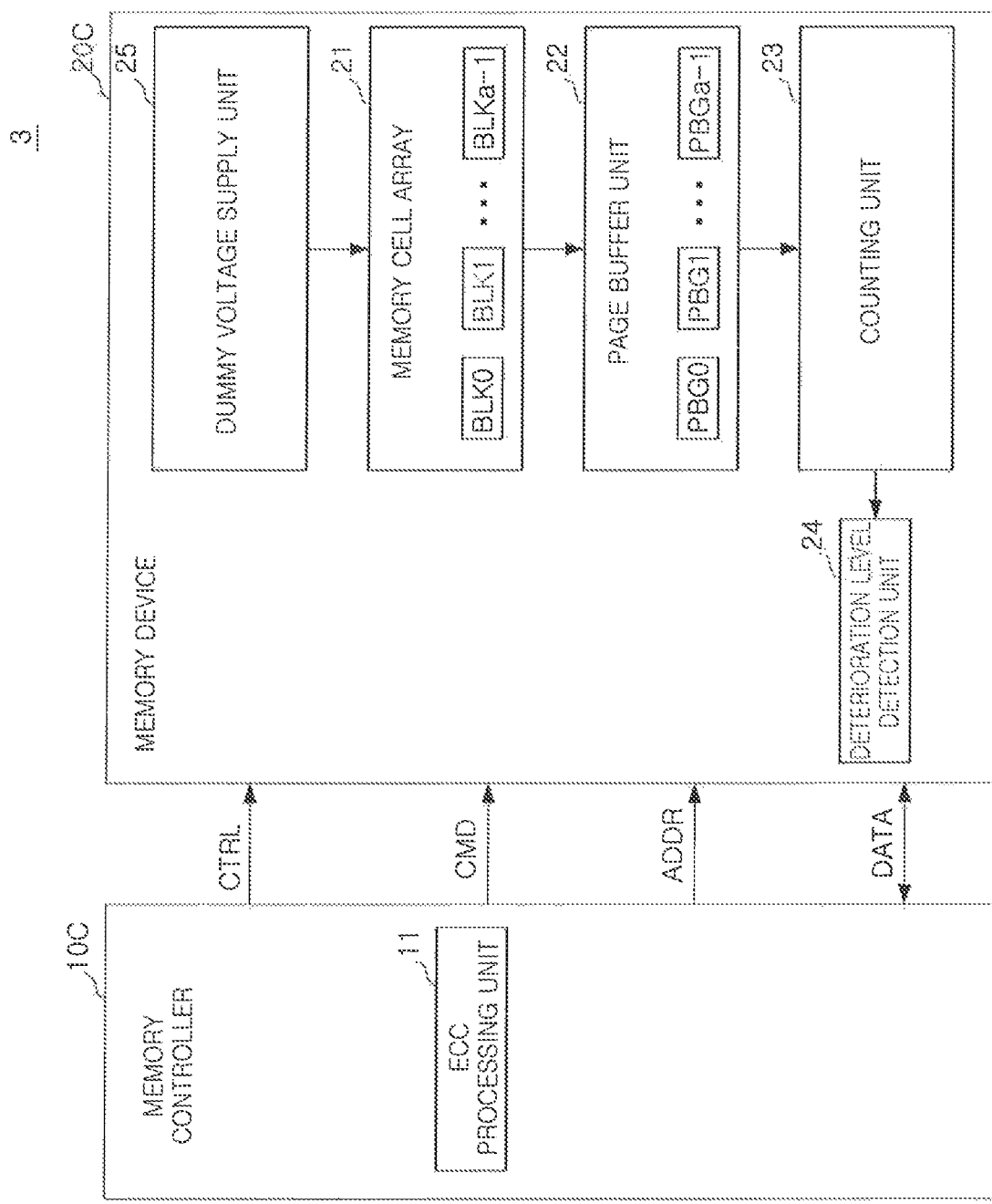
FIG. 9 is a schematic block diagram of a memory system according to an exemplary embodiment of the inventive concept.

FIG. 9 is a schematic block diagram of a memory system 3 according to an exemplary embodiment of the inventive concept. The memory system 3 according to the exemplary embodiment of FIG. 9 is similar to the memory system 2 according to the exemplary embodiment of FIG. 8. Therefore, for convenience of explanation, a further description of elements and processes previously described may be omitted, and the description below may focus only on differences between the memory system 3 of FIG. 9 and the memory system 2 of FIG. 8. The memory system 3 according to the exemplary embodiment of FIG. 9 further includes a dummy voltage supply unit 25 included in a memory device 20C, as compared to the memory system 2 according to the exemplary embodiment of FIG. 8. The memory device 20C in the exemplary embodiment of FIG. 9 is connected to a memory controller 10C.

In an exemplary embodiment, the dummy voltage supply unit 25 provides a dummy voltage to memory cells selected from among a plurality of memory cells. The dummy voltage supply unit 25 may also be referred to herein as a dummy voltage supply generator or a dummy voltage supply generator circuit. The dummy voltage may be supplied before read voltages to read each bit page. In a case in which the dummy voltage is supplied to memory cells selected from the dummy voltage supply unit 25, data of the memory cells may be stored in page buffers of the page buffer unit 22, and the counting unit 23 may count '1' or '0' as a result of reading data, thereby counting ON cells or OFF cells of the memory cells. The dummy voltage may have a voltage magnitude corresponding to one of an erase state E of selected memory cells and a plurality of program states P1 to P7. For example, the dummy voltage may have a voltage magnitude corresponding to at least one of a most significant state and a least significant state among a plurality of states of the memory cells. For example, in a case in which the dummy voltage has a voltage magnitude corresponding to the most significant state to a word line of the selected memory cells, the counting unit 23 may count OFF cells of the selected memory cells.

In a case in which the dummy voltage has a voltage magnitude corresponding to the least significant state to the word line of the selected memory cells, the counting unit 23 may count ON cells of the selected memory cells.

The deterioration level detection unit 24 may detect a deterioration level according to a counting result of 'ON cell' or 'OFF cell' of the memory cells. For example, in an exemplary embodiment, the deterioration level detection unit 24 compares a first counting result of ON cells or OFF cells currently counted with a second counting result of ON cells or OFF cells in an initial state, thereby determining a change of a threshold voltage of the memory cells. The deterioration level detection unit 24 may detect a deterioration level based on the change of the threshold voltage of the memory cells.

In a case in which the dummy voltage is supplied to the memory cells, the deterioration level detection unit 24 may detect a deterioration level using the dummy voltage. In a case in which a read voltage is supplied to the memory cells, the deterioration level detection unit 24 may detect the deterioration level using the read voltage.

Figure 10:
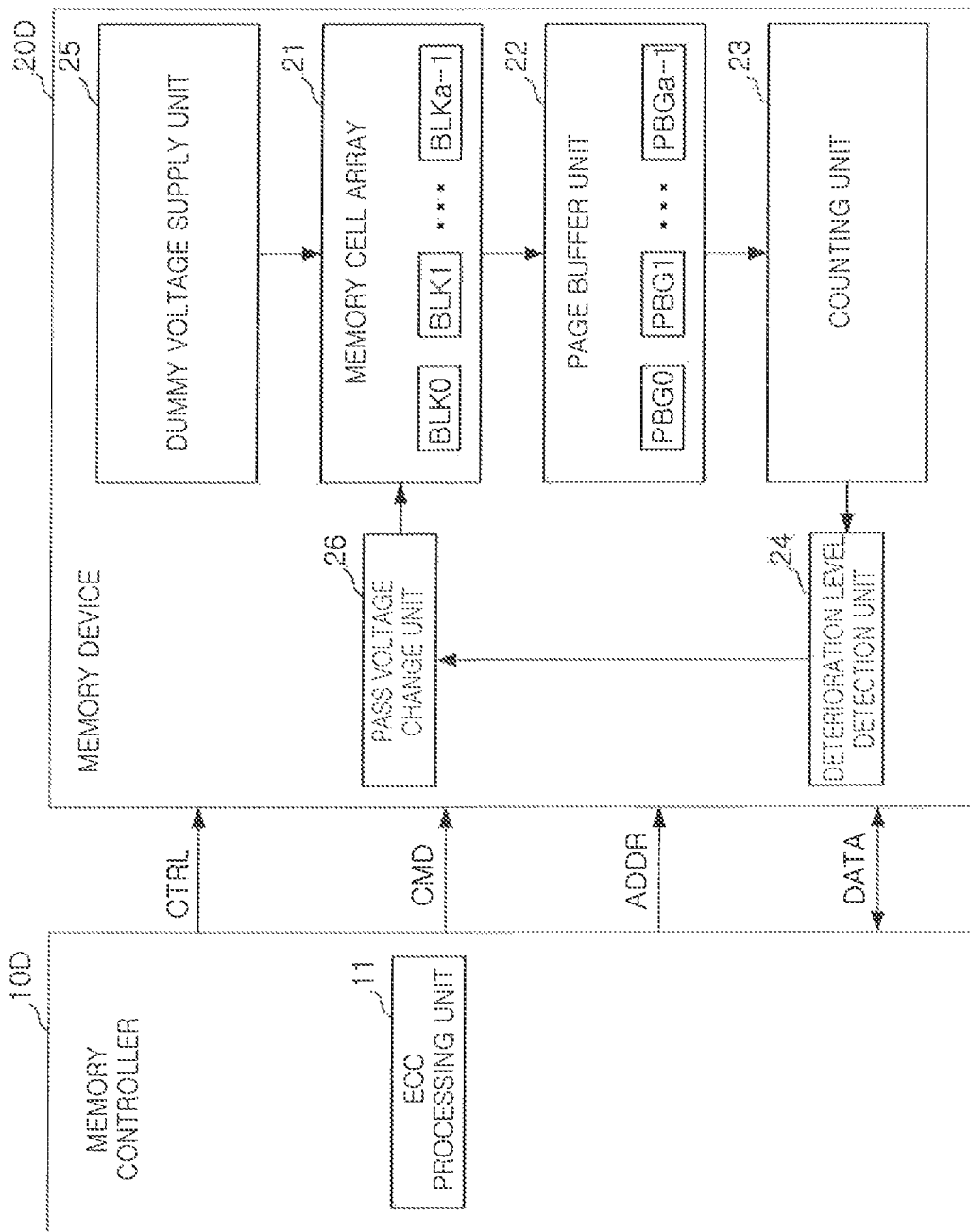
FIG. 10 is a schematic block diagram of a memory system according to an exemplary embodiment of the inventive concept.

FIG. 10 is a schematic block diagram of a memory system 4 according to an exemplary embodiment of the inventive concept.

The memory system 4 according to the exemplary embodiment of FIG. 10 is similar to the memory system 3 according to the exemplary embodiment of FIG. 9. Therefore, for convenience of explanation, a further description of elements and processes previously described may be omitted, and the description below may focus only on differences between the memory system 4 of FIG. 10 and the memory system 3 of FIG. 9. The memory system 4 according to the exemplary embodiment of FIG. 10 further includes a pass voltage change unit 26 included in a memory device 20D, as compared to the memory system 3 according to the exemplary embodiment of FIG. 9. The memory device 20D in the exemplary embodiment of FIG. 10 is connected to a memory controller 10D. According to exemplary embodiments, the pass voltage change unit 26 changes a pass voltage supplied by a voltage generator VG according to the deterioration level. The pass voltage supplied by the voltage generator VG is to be supplied to one or more unselected word lines. In exemplary embodiments, the pass voltage change unit 26 reduces the pass voltage in response to a change of a threshold voltage. In other words, a change level of the threshold voltage may be equal to a reduction level of the pass voltage. According to an exemplary embodiment, the pass voltage change unit 26 may change the pass voltage supplied to the unselected word lines according to a temperature change. In this case, the temperature change may be provided by a memory controller.

As illustrated in FIGS. 9 and 10, in exemplary embodiments, the dummy voltage supply unit 25 and the pass voltage change unit 26 are separate components. However, exemplary embodiments of the inventive concept are not limited thereto. For example, in exemplary embodiments, the dummy voltage supply unit 25 and the pass voltage change unit 26 may be integrated with the voltage generator VG of FIG. 2.

FIGS. 11 to 14 are views illustrating a method of determining one or more unselected word lines according to exemplary embodiments of the inventive concept.

FIGS. 11 to 14 illustrate a case in which a fourth word line WL4 is selected from among a plurality of word lines, and a read voltage Vr is supplied to the fourth word line WL4, in order to perform a read operation in memory cells MCEL connected to the fourth word line WL4. In FIGS. 11 to 14, the other word lines WL0, WL1, WL2, WL3, WL5, WL6, and WL7 are not selected, and a pass voltage is supplied to these unselected word lines.

Figure 11:
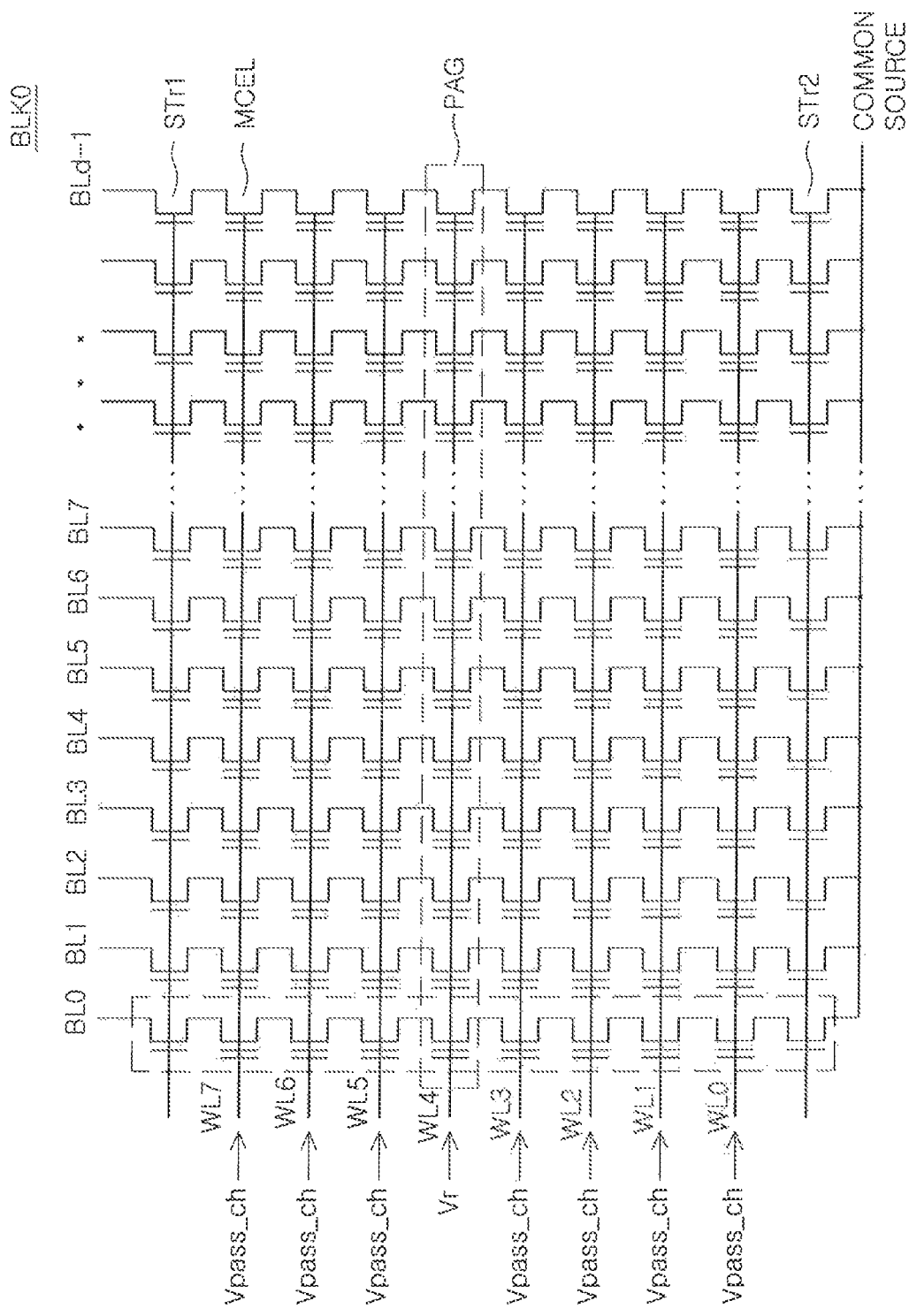
FIGS. 11 to 14 are views illustrating a method of determining one or more unselected word lines according to exemplary embodiments of the inventive concept.

Referring to FIG. 11, a pass voltage Vpass_ch changed based on a deterioration level is supplied to all unselected word lines WL0, WL1, WL2, WL3, WL5, WL6, and WL7.

Figure 12:
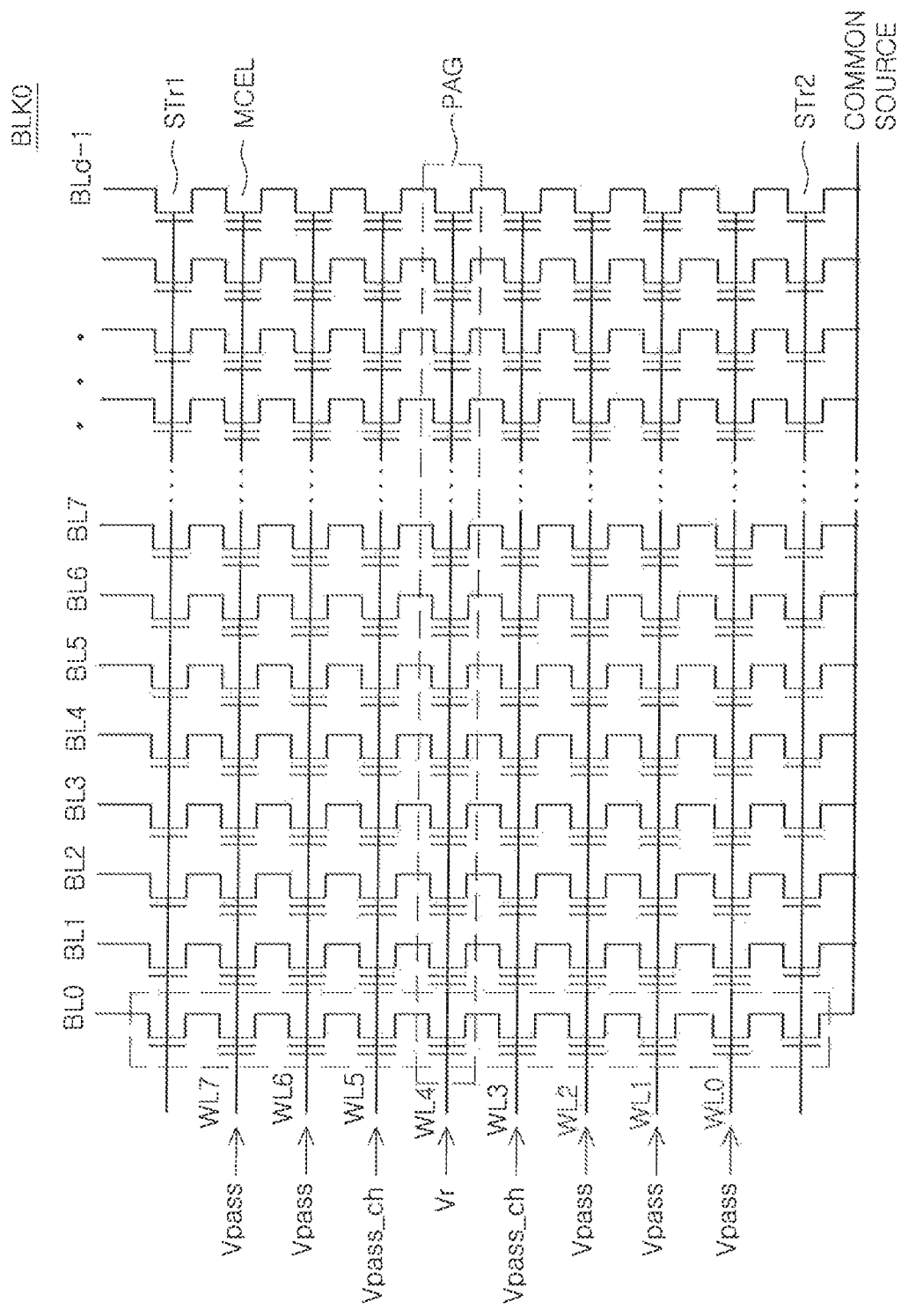

Referring to FIG. 12, the pass voltage Vpass_ch, changed based on the deterioration level, may be supplied to the fifth word line WL5 and a third word line WL3 disposed adjacent to the fourth word line WL4, selected from among the unselected word lines WL0, WL1, WL2, WL3, WL5, WL6, and WL7.

Figure 13:
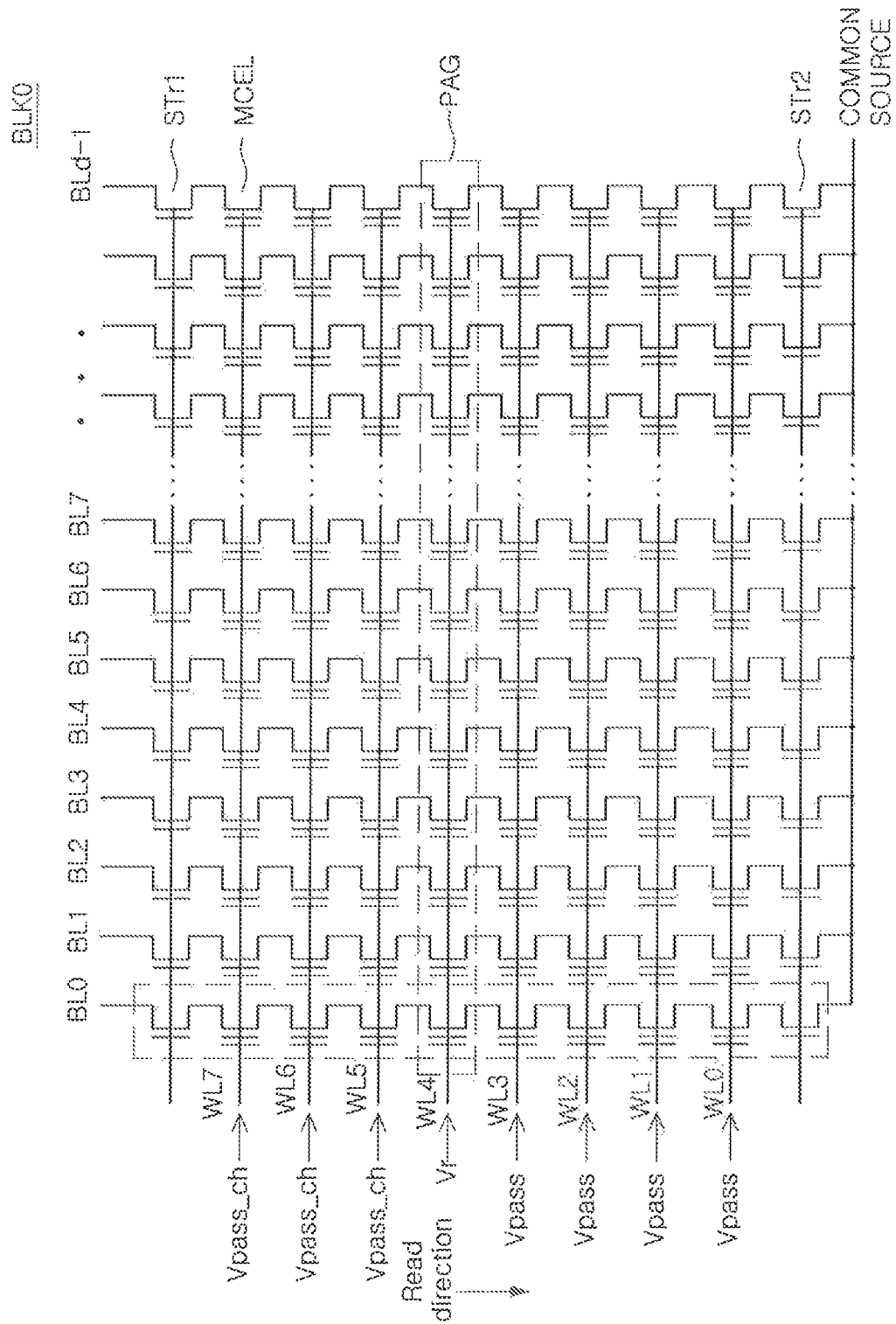
Figure 14:
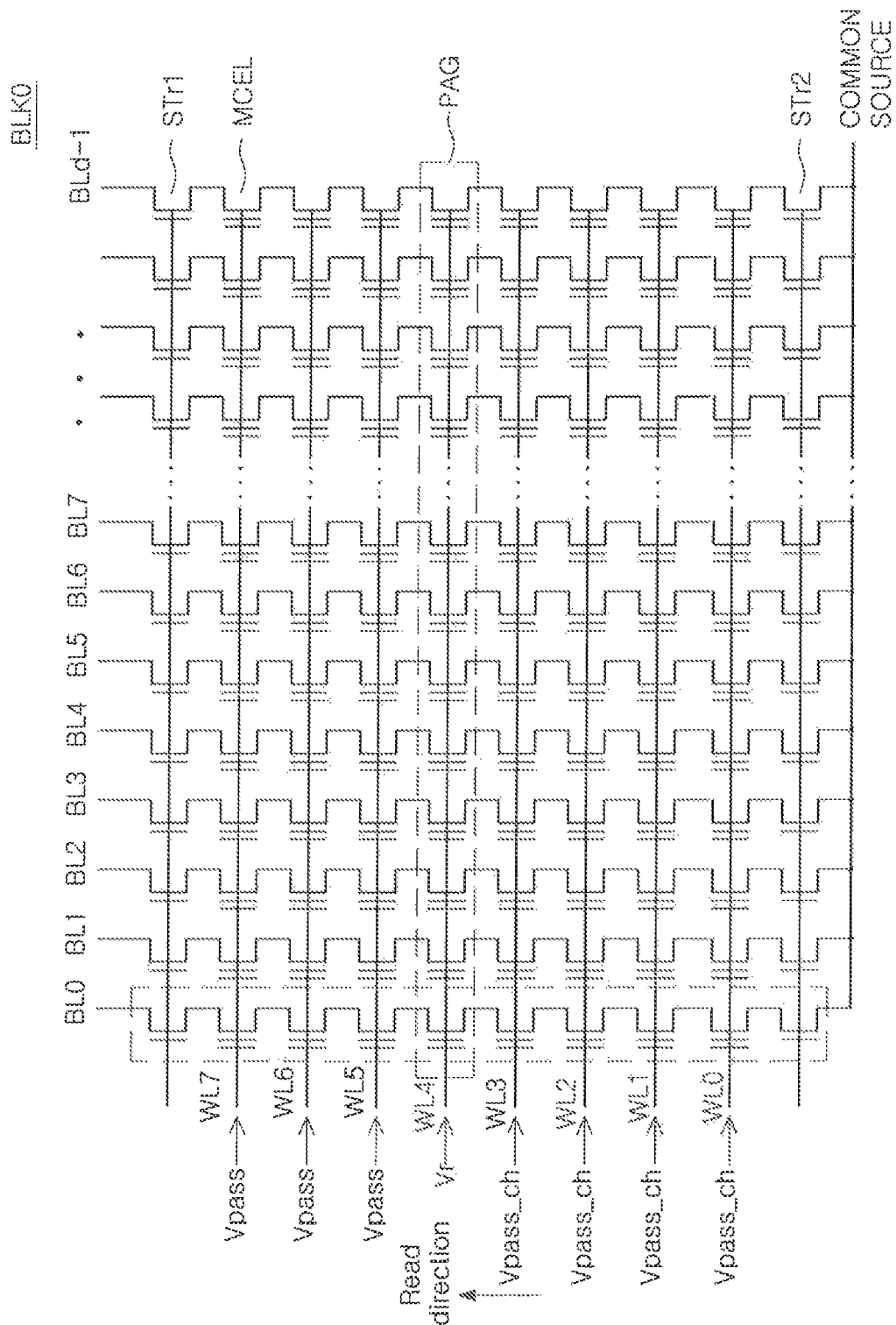

Referring to FIGS. 13 and 14, the pass voltage Vpass_ch, changed based on the deterioration level, is supplied to one or more unselected word lines WL0, WL1, WL2, WL3, WL5, WL6, and WL7 in a page read direction. In this case, the page read direction may be the same as an arrangement direction of sequentially arranged pages. For example, the pass voltage Vpass_ch, changed based on the deterioration level, may be supplied to word lines from among the unselected word lines WL0, WL1, WL2, WL3, WL5, WL6, and WL7, in which a page read operation has been completed.

In FIG. 13, in a case in which the page read direction is a direction from a seventh word line WL7 to a zero-th word line WL0, the pass voltage Vpass_ch, changed based on the deterioration level, is supplied to a fifth word line WL5, a sixth word line WL6, and a seventh word line WL7, in which a read operation is completed at a time before the fourth word line WL4 to which the read voltage Vr is currently supplied.

In a manner similar to the description above, in FIG. 14, in a case in which the page read direction is a direction from the zero-th word line WL0 to the seventh word line WL7, the pass voltage Vpass_ch, changed based on the deterioration level, is supplied to the zero-th word line WL0, a first word line WL1, a second word line WL2, the third word line WL3, and the fourth word line WL4, in which the read operation is completed at a time before the fourth word line WL4 to which the read voltage Vr is currently supplied.

Figure 15:
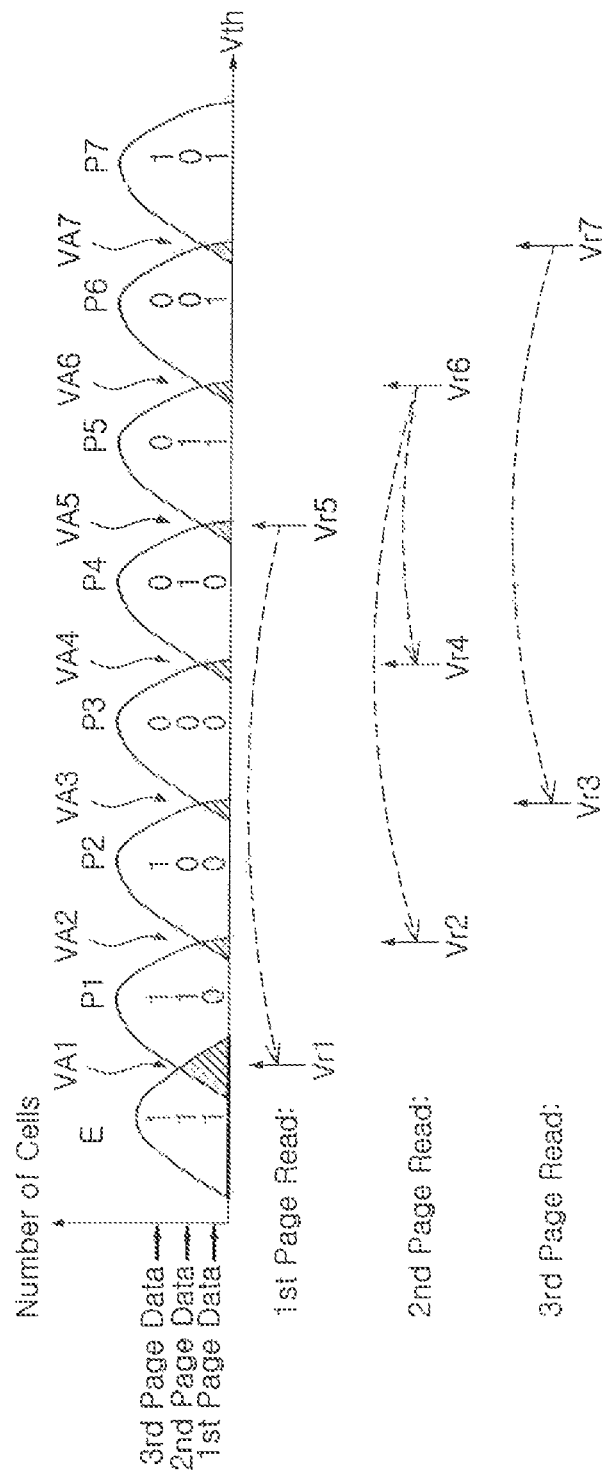
FIGS. 15 to 17 are views illustrating a time at which a changed pass voltage is supplied according to exemplary embodiments of the inventive concept.
Figure 16:
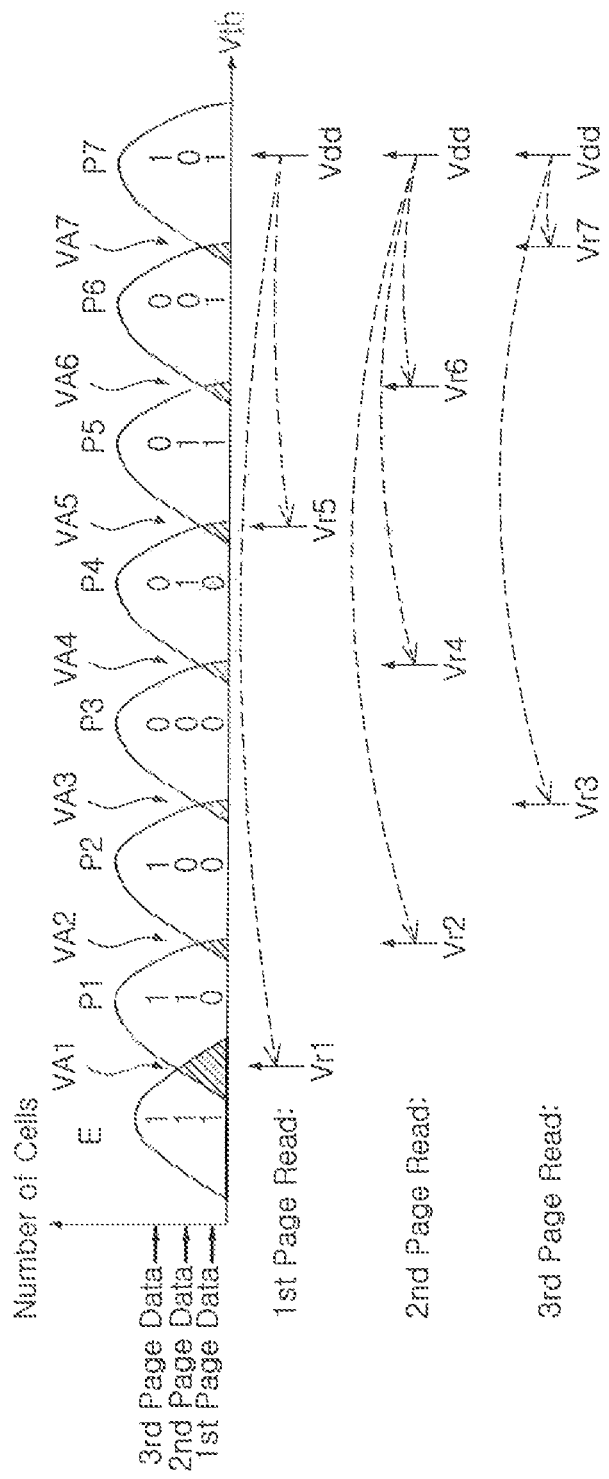
Figure 17:
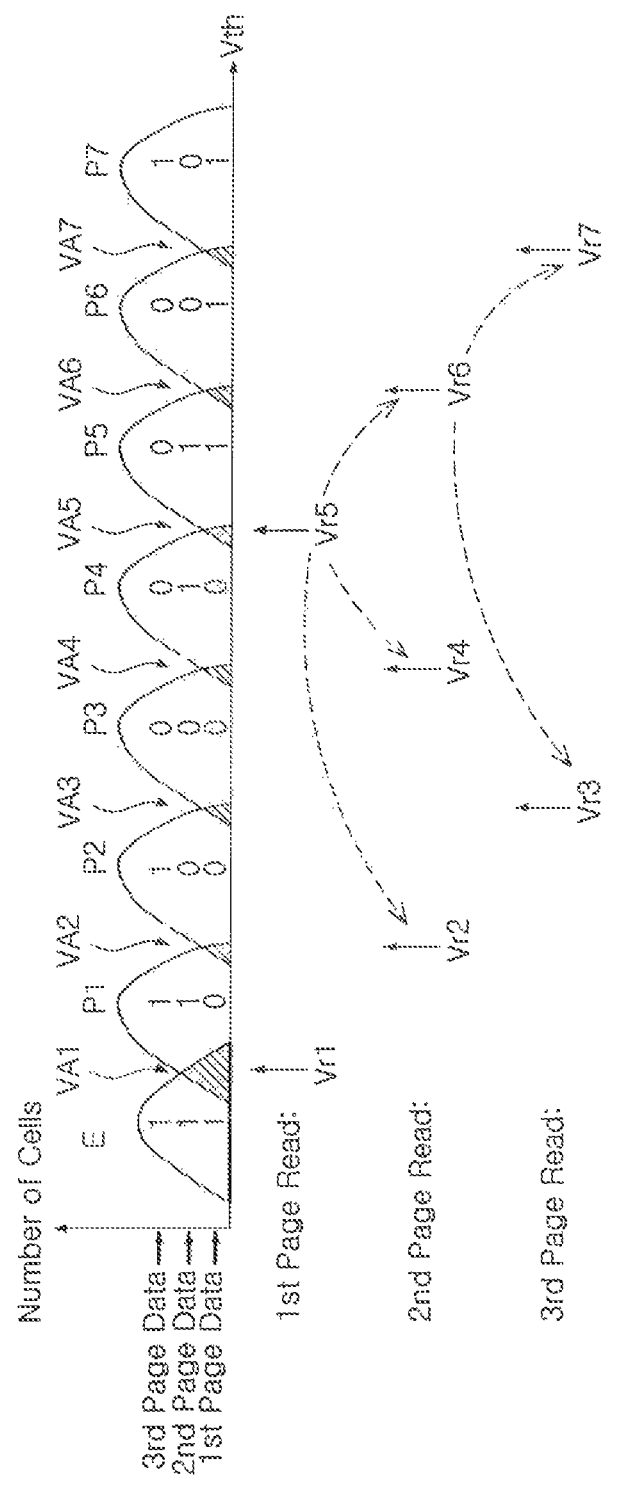

FIGS. 15 to 17 are views illustrating a time and a time section in which a changed pass voltage is supplied according to exemplary embodiments of the inventive concept.

Referring to FIG. 15, a pass voltage changed based on a deterioration level, detected from a prior read voltage from among a plurality of read voltages supplied at a time of a single bit page read, may be supplied at an application time and in a time section of a posterior read voltage.

In FIG. 15, a case in which a fifth read voltage Vr5 is the prior read voltage between a first read voltage Vr1 supplied at a time of a first page read and the fifth read voltage Vr5, a sixth read voltage Vr6 is the prior read voltage from among a second read voltage Vr2 supplied at a time of a second page read, a fourth read voltage Vr4, and a sixth read voltage Vr6, and a seventh read voltage Vr7 is the prior read voltage from among a third read voltage Vr3 supplied at a time of a third page read and a seventh read voltage Vr7, is taken as an example. However, exemplary embodiments of the inventive concept are not limited thereto. For example, according to exemplary embodiments, the prior read voltage and the posterior read voltage may be changed.

The pass voltage changed based on the deterioration level detected from the fifth read voltage Vr5 (e.g., the prior read voltage) supplied at a time of the first page read may be supplied at an application time and in a time section of the first read voltage Vr1 (e.g., the posterior read voltage).

The pass voltage changed based on the deterioration level detected from the sixth read voltage Vr6 (e.g., the prior read voltage) supplied at a time of the second page read may be supplied at an application time and in a time section of the second read voltage Vr2 and the fourth read voltage Vr4 (e.g., the posterior read voltages). The pass voltage changed based on the deterioration level detected from the fourth read voltage Vr4 (e.g., the posterior read voltage) may be supplied when the second read voltage Vr2 (e.g., a final subsequent read voltage) is applied.

The pass voltage changed based on the deterioration level detected from the seventh read voltage Vr7 (e.g., the prior read voltage) supplied at a time of the third page read may be supplied at an application time and in a time section of the third read voltage Vr3 (e.g., the posterior read voltage).

Referring to FIG. 16, the pass voltage changed based on the deterioration level detected from a dummy voltage may be supplied at an application time and in a time section of a plurality of read voltages supplied at a time of a single bit page read. The dummy voltage may be supplied before the plurality of read voltages supplied to distinguish a single bit page.

In FIG. 16, the pass voltage changed based on a deterioration detection level detected from a dummy voltage (Vdd) in the first page read may be supplied at an application time and in a time section of the first read voltage Vr1 and the fifth read voltage Vr5. In addition, the pass voltage changed based on the deterioration detection level detected from the dummy voltage (Vdd) in the second page read may be supplied at an application time and in a time section of the second read voltage Vr2, the fourth read voltage Vr4, and the sixth read voltage Vr6. In FIG. 16, the pass voltage changed based on the deterioration detection level detected from the dummy voltage (Vdd) in the third page read may be supplied at an application time and in a time section of the third read voltage Vr3 and the seventh read voltage Vr7.

Referring to FIG. 17, the pass voltage changed based on the deterioration level detected at a time of a single bit page read may be supplied at a time of a subsequent bit page read.

In FIG. 17, the pass voltage changed based on the deterioration level detected from the first page read corresponding to a prior bit page may be supplied at an application time and in a time section of a read voltage of the second page read and the third page read, corresponding to a posterior bit page. For example, the pass voltage changed based on the deterioration level detected from the fifth read voltage Vr5 supplied at a time of the first page read may be supplied at an application time and in a time section of the sixth read voltage Vr6, the second read voltage Vr2, and the fourth read voltage Vr4, supplied at a time of the second page read. In addition, the pass voltage changed based on the deterioration level detected from the sixth read voltage Vr6 supplied at a time of the second page read may be supplied at an application time and in a time section of the third read voltage Vr3 and the seventh read voltage Vr7, supplied at a time of the third page read.

Figure 18:
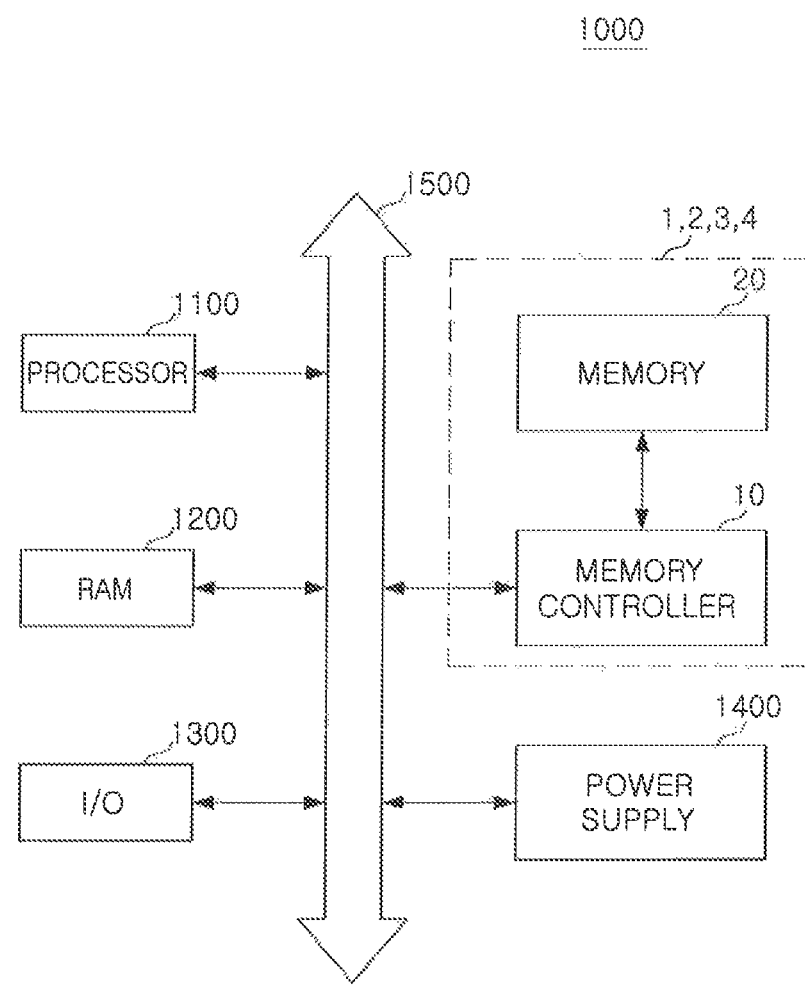
FIG. 18 is a block diagram of a computing system according to an exemplary embodiment of the inventive concept.

FIG. 18 is a block diagram of a computing system according to an exemplary embodiment of the inventive concept.

Referring to FIG. 18, in an exemplary embodiment, a computing system 1000 includes a processor 1100, a random access memory (RAM) 1200, an input/output device 1300, a power supply 1400, and a memory system 1. The computing system 1000 may further include ports communicating with a video card, a sound card, a memory card, a USB device, or other electronic devices. The computing system 1000 may be implemented as, for example, a personal computer or a portable electronic device, such as a laptop computer, a mobile phone, a personal digital assistant (PDA), or a camera. The processor 1100 may perform specific calculations or tasks. According to an exemplary embodiment, the processor 1100 may be provided as a microprocessor or a central processing unit (CPU). The processor 1100 may communicate with the RAM 1200, the input/output device 1300, and the memory system 1 through a bus 1500. The bus 1500 may be, for example, an address bus, a control bus, or a data bus. According to an exemplary embodiment, the processor 1100 may also be connected to an expansion bus such as, for example, a peripheral component interconnect (PCI) bus. The RAM 1200 may store data required for an operation of the computing system 1000. For example, the RAM 1200 may be implemented as a dynamic RAM (DRAM), a mobile DRAM, a static RAM (SRAM), a PRAM, an FRAM, an RRAM, and/or an MRAM. The input/output device 1300 may include, for example, a keyboard, a keypad, or a mouse, as well as a printer or a display. The power supply 1400 may provide an operating voltage required for an operation of the computing system 1000.

The memory system 1 according to an exemplary embodiment may be provided as a storage device of an information processing device combined with an application chipset, a camera image processor, a mobile DRAM, etc., to exchange high-capacity data. Memory devices 20A, 20B, 20C, and 20D, as well as memory systems 1, 2, 3, and 4 according to exemplary embodiments may be mounted using various types of packages. For example, the memory devices 20A, 20B, 20C, and 20D, as well as the memory systems 1, 2, 3, and 4 may be mounted using packages such as, for example, a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multichip package (MCP), a wafer-level fabricated package (WFP), and a wafer-level processed stack package (WSP).

As set forth above, according to exemplary embodiments of the present inventive concept, a pass voltage supplied to an unselected word line based on a deterioration level of a threshold voltage of memory cells connected to a selected word line may be changed, thereby improving a memory system by eliminating or reducing the occurrence of a read error.

As is traditional in the field of the inventive concept, exemplary embodiments are described, and illustrated in the drawings, in terms of functional blocks, units and/or modules. Those skilled in the art will appreciate that these blocks, units and/or modules may be physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A memory device, comprising:
   a voltage generator that provides a read voltage to a selected word line and provides a pass voltage to a plurality of unselected word lines, wherein the selected word line and the unselected word lines are connected to a plurality of memory cells; and
   a deterioration level detection circuit that detects a deterioration level of memory cells connected to the selected word line based on data of memory cells that receive the read voltage,
   wherein the memory cells connected to the selected word line and the memory cells that receive the read voltage are included in the plurality of memory cells,
   wherein the voltage generator changes the pass voltage provided to the unselected word lines based on the deterioration level.

2. The memory device of claim 1, wherein the deterioration level detection circuit determines a change of a threshold voltage of the memory cells that receive the read voltage by counting at least one of ON cells and OFF cells corresponding to the read voltage based on the data of the memory cells that receive the read voltage.

3. The memory device of claim 2, wherein the deterioration level detection circuit detects the deterioration level based on the change of the threshold voltage of the memory cells that receive the read voltage.

4. The memory device of claim 2, wherein the voltage generator changes the pass voltage based on the change of the threshold voltage.

5. The memory device of claim 4, wherein the voltage generator reduces the pass voltage in response to the change of the threshold voltage.

6. The memory device of claim 1, wherein the voltage generator sequentially provides the read voltage a plurality of times to read a bit page, and provides the pass voltage having been changed based on a prior read voltage from among a plurality of read voltages in a time section in which a posterior read voltage is applied.

7. The memory device of claim 1, wherein the voltage generator sequentially provides the read voltage a plurality of times to read a page including a first plurality of bit pages, and provides the pass voltage having been changed based on the deterioration level detected in a prior bit page from among a second plurality of bit pages at a time of a read operation of posterior bit pages.

* * * * *